United States Patent
Ham et al.

(10) Patent No.: US 9,666,737 B2
(45) Date of Patent: May 30, 2017

(54) SOLAR CELL AND METHOD OF FABRICATING THE SAME

(71) Applicant: INDUSTRY-UNIVERSITY COOPERATION FOUNDATION HANYANG UNIVERSITY (IUCF-HYU), Seoul (KR)

(72) Inventors: Gi Yul Ham, Seoul (KR); Hyeongtag Jeon, Seoul (KR); Seok Yoon Shin, Goyang-si (KR); Joohyun Park, Seoul (KR)

(73) Assignee: INDUSTRY-UNIVERSITY COOPERATION FOUNDATION HANYANG UNIVERSITY (IUCF-HYU)

( * ) Notice: Subject to any disclaimer, the term of this patent is extended or adjusted under 35 U.S.C. 154(b) by 0 days.

(21) Appl. No.: 15/258,367

(22) Filed: Sep. 7, 2016

(65) Prior Publication Data

US 2017/0005213 A1     Jan. 5, 2017

Related U.S. Application Data

(62) Division of application No. 14/602,732, filed on Jan. 22, 2015, now Pat. No. 9,466,744.

(30) Foreign Application Priority Data

Jan. 22, 2014   (KR) ........................ 10-2014-0007717

(51) Int. Cl.
*H01L 31/032*  (2006.01)
*H01L 31/036*  (2006.01)
(Continued)

(52) U.S. Cl.
CPC ...... *H01L 31/0324* (2013.01); *H01L 21/0262* (2013.01); *H01L 21/02485* (2013.01);
(Continued)

(58) Field of Classification Search
CPC .... H01L 31/0324; H01L 31/036; H01L 31/18
See application file for complete search history.

(56) References Cited

U.S. PATENT DOCUMENTS 8,476,100 B2 *  7/2013  Chou .................. H01L 31/0749
                                                   257/E21.211
9,496,067 B2 * 11/2016  Tenne .................... B82Y 30/00
(Continued)

OTHER PUBLICATIONS

Sanchez-Juarez et al., Fabrication of SnS2/SnS heterojunction thin film diodes by plasma-enhanced chemical vapor deposition, Thin Solid Films, 480-481, 2005, pp. 452-456.*

(Continued)

*Primary Examiner* — Earl Taylor
(74) *Attorney, Agent, or Firm* — Ladas & Parry LLP

(57) ABSTRACT

The inventive concepts provide a solar cell and a method of fabricating the same. The method includes preparing a substrate in a chamber, forming a light absorbing layer on the substrate by setting temperature in the chamber to a first temperature and by supplying a first source into the chamber, forming a buffer layer on the substrate by setting temperature in the chamber to a second temperature lower than the first temperature and by supplying the first source into the chamber, and forming a window layer on the substrate by supplying a second source different from the first source into the chamber.

7 Claims, 8 Drawing Sheets

(51) Int. Cl.
*H01L 31/18* (2006.01)
*H01L 21/02* (2006.01)
*H01L 31/072* (2012.01)

(52) U.S. Cl.
CPC .. *H01L 21/02565* (2013.01); *H01L 21/02568* (2013.01); *H01L 31/036* (2013.01); *H01L 31/072* (2013.01); *H01L 31/18* (2013.01); *Y02E 10/50* (2013.01); *Y02P 70/521* (2015.11)

(56) References Cited

U.S. PATENT DOCUMENTS

| | | | |
|---|---|---|---|
| 2006/0180200 A1* | 8/2006 | Platzer Bjorkman | H01L 31/0322 136/265 |
| 2009/0205714 A1* | 8/2009 | Kuhnlein | C23C 18/40 136/264 |
| 2009/0277499 A1* | 11/2009 | Aoki | H01L 31/0749 136/256 |
| 2009/0301543 A1* | 12/2009 | Reddy | H01L 31/0465 136/244 |
| 2010/0047958 A1* | 2/2010 | Kushiya | H01L 31/0322 438/94 |
| 2010/0206381 A1* | 8/2010 | Aida | H01L 31/0749 136/261 |
| 2011/0000541 A1* | 1/2011 | Brendel | C23C 14/0623 136/258 |
| 2011/0155234 A1* | 6/2011 | Chou | H01L 31/0749 136/256 |
| 2011/0209763 A1* | 9/2011 | Cho | H01L 21/02422 136/264 |
| 2012/0138129 A1* | 6/2012 | Kim | H01L 31/0682 136/255 |
| 2012/0295396 A1* | 11/2012 | Teeter | C23C 14/0629 438/95 |
| 2013/0037090 A1* | 2/2013 | Bag | H01L 31/0326 136/252 |
| 2013/0125988 A1* | 5/2013 | Cao | H01L 31/18 136/264 |
| 2013/0319502 A1* | 12/2013 | Chawla | H01L 31/022466 136/246 |
| 2014/0048132 A1* | 2/2014 | Choi | H01L 31/02167 136/256 |
| 2014/0093645 A1* | 4/2014 | Thimsen | C23C 16/305 427/255.4 |
| 2014/0159120 A1* | 6/2014 | Ahmed | H01L 21/2254 257/213 |
| 2014/0216555 A1* | 8/2014 | Aydil | H01L 31/0326 136/264 |
| 2014/0230888 A1* | 8/2014 | Kim | H01L 31/0749 136/255 |
| 2014/0287264 A1* | 9/2014 | Tenne | C01G 19/00 428/699 |
| 2015/0044813 A1* | 2/2015 | Yamanouchi | H01L 31/0326 438/95 |
| 2015/0047699 A1* | 2/2015 | Barnes | H01L 31/022466 136/256 |
| 2015/0047707 A1* | 2/2015 | Kim | H01L 31/02168 136/259 |
| 2015/0059842 A1* | 3/2015 | Bae | H01L 31/022425 136/256 |
| 2015/0140400 A1* | 5/2015 | Yamazaki | H01M 10/0459 429/136 |
| 2015/0207000 A1* | 7/2015 | Ham | H01L 31/0324 136/252 |

OTHER PUBLICATIONS

Sun et al., Band alignment of SnS/Zn(O,S) heterojunctions in SnS thin film solar cells, Applied Physics Letters, 103, 181904, 2013, 6 pages.*

Burton et al., Synthesis, Characterization, and Electronic Structure of Single-Crystal SnS, Sn2S3, and SnS2, Chemistry of Materials, 25, 2013, pp. 4908-4916.*

* cited by examiner

SOLAR CELL AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0007717, filed on Jan. 22, 2014, in the Korean Intellectual Property Office, the disclosure of which is hereby incorporated by reference in its entirety.

BACKGROUND

The inventive concepts relate to a solar cell and a method of fabricating the same. More particularly, the inventive concepts a solar cell including a light absorbing layer and a buffer layer formed at different temperatures from each other and a method of fabricating the same.

A solar cell is a photovoltaic energy conversion system that converts light energy emitted from the sun into electrical energy.

A silicon solar cell uses a P-N junction diode formed in silicon for the photovoltaic energy conversion. However, the silicon used in the silicon solar cell should have a high degree of purity and a low defect density to prevent premature recombination of electrons and holes. Since these technical requirements increase a cost of silicon, the silicon solar cell may have a high fabrication cost. In addition, only photons having energies equal to or greater than a band gap are used to generate a current, and thus, the silicon of the silicon solar cell may be doped with impurities in order to have a lower band gap. However, since electrons excited by blue light or ultraviolet rays have excessive energy due to the low band gap, they may be consumed as heat, so far from generating a current.

Moreover, a P-type layer should be sufficiently thick to increase a probability of capturing photons. However, excited excitons (electron-hole pairs) may be recombined by the thick P-type before they reach a P-N junction, so efficiency of the silicon solar cell may be low.

To solve these problems, a copper-indium-gallium-selenium (CIGS) thin film solar cell is being developed. The CIGS thin film solar cell has efficiency higher than that of the silicon solar cell and relatively high stability. In addition, an initial deterioration phenomenon is not caused in the CIGS thin film solar cell. Thus, various researches are being conducted for commercialization of the CIGS thin film solar cell.

For example, Korean Patent Publication No. 10-2012-0079292 (Korean patent application No. 10-2011-0000509) discloses a hybrid solar cell having a stack structure of the CIGS thin film solar cell and the silicon solar cell (or the CIGS thin film solar cell and a dye-sensitized solar cell) and a method of fabricating the same.

However, indium (In) and gallium (Ga) required for fabricating the CIGS thin film solar cell are expensive, so the fabrication cost of the CIGS thin film solar cell is high. In addition, it is difficult to optimize a co-evaporation process of Cu, In, Ga, and Se, which is used to form the CIGS thin film. Moreover, a cadmium-sulfur (CdS) buffer layer included in the CIGS thin film solar cell is formed by a wet process, so it is impossible to continuously form the CdS buffer layer and another layer formed by a vacuum process (e.g., a sputtering process). This means that productivity of the CIGS thin film solar is low. Furthermore, cadmium (Cd) of the CdS buffer layer is a heavy metal having potent toxicity, and thus, environmental pollution may be caused.

Thus, it is required to develop a solar cell with an eco-friendly characteristic, high-productivity, and a low fabrication cost.

SUMMARY

Embodiments of the inventive concepts may provide a solar cell capable of reducing a fabrication cost and a method of fabricating the same.

Embodiments of the inventive concepts may also provide an eco-friendly solar cell and a method of fabricating the same.

Embodiments of the inventive concepts may also provide a method of fabricating a solar cell capable of easily optimizing fabrication processes.

Embodiments of the inventive concepts may also provide a method of fabricating a solar cell capable of simplifying fabrication processes.

In one aspect, a method of fabricating a solar cell may include: preparing a substrate in a chamber; forming a light absorbing layer on the substrate by setting temperature in the chamber to a first temperature and by supplying a first source into the chamber; forming a buffer layer on the substrate by setting temperature in the chamber to a second temperature lower than the first temperature and by supplying the first source into the chamber; and forming a window layer on the substrate by supplying a second source different from the first source into the chamber.

In some embodiments, the first source may include tin (Sn) and sulfur (S), and the second source may include tin (Sn) and oxygen (O).

In some embodiments, forming the buffer layer may further include: supplying the second source into the chamber before or after supplying the first source.

In some embodiments, the light absorbing layer and the buffer layer may be formed of a compound of tin (Sn) and sulfur (S), and a crystal structure of the light absorbing layer may be different from a crystal structure of the buffer layer.

In some embodiments, a photonic band gap of the light absorbing layer may be smaller than a photonic band gap of the buffer layer.

In another aspect, a method of fabricating a solar cell may include: preparing a substrate; forming a light absorbing layer on the substrate at a first temperature; forming a buffer layer on the light absorbing layer at a second temperature different from the first temperature; and forming a window layer on the buffer layer.

In some embodiments, the second temperature may be lower than the first temperature.

In some embodiments, the light absorbing layer may include a first compound that is formed by supplying a first source at the first temperature, and the buffer layer may include a second compound that is formed by supplying the first source at the second temperature. The second compound may include the same elements as the first compound, and a composition ratio of the second compound may be different from a composition ratio of the first compound.

In some embodiments, the first compound may include tin(II) sulfide (SnS), and the second compound may include tin(IV) sulfide ($SnS_2$).

In some embodiments, forming the buffer layer may further include: providing a second source comprising: the same metal as the first source; and a reaction gas different from a reaction gas included in the first source.

In some embodiments, the buffer layer may include $SnS_2$ formed by the first source and $SnO_2$ formed by the second source.

In some embodiments, the light absorbing layer, the buffer layer, and the window layer may be formed in the same chamber.

In some embodiments, the light absorbing layer, the buffer layer, and the window layer may be formed by dry processes.

In still another aspect, a solar cell may include: a light absorbing layer disposed on a substrate and including a first compound; a buffer layer disposed on the light absorbing layer and including a second compound, the second compound including the same elements as the first compound, and the second compound having a composition ratio different from that of the first compound; and a window layer disposed on the buffer layer.

In some embodiments, the light absorbing layer and the buffer layer may have different crystal structures from each other.

In some embodiments, the light absorbing layer may have an orthorhombic crystal structure, and the buffer layer may have a hexagonal crystal structure.

In some embodiments, the first compound may include tin(II) sulfide (SnS), and the second compound may include tin(IV) sulfide ($SnS_2$).

In some embodiments, the window layer and the buffer layer may include an oxide of a metal element included in the first and second compounds.

In some embodiments, each of the light absorbing layer and the buffer layer may be formed of a binary compound.

In some embodiments, the light absorbing layer may be formed of a non-rare-earth element, and the buffer layer may be formed of a non-cadmium element.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
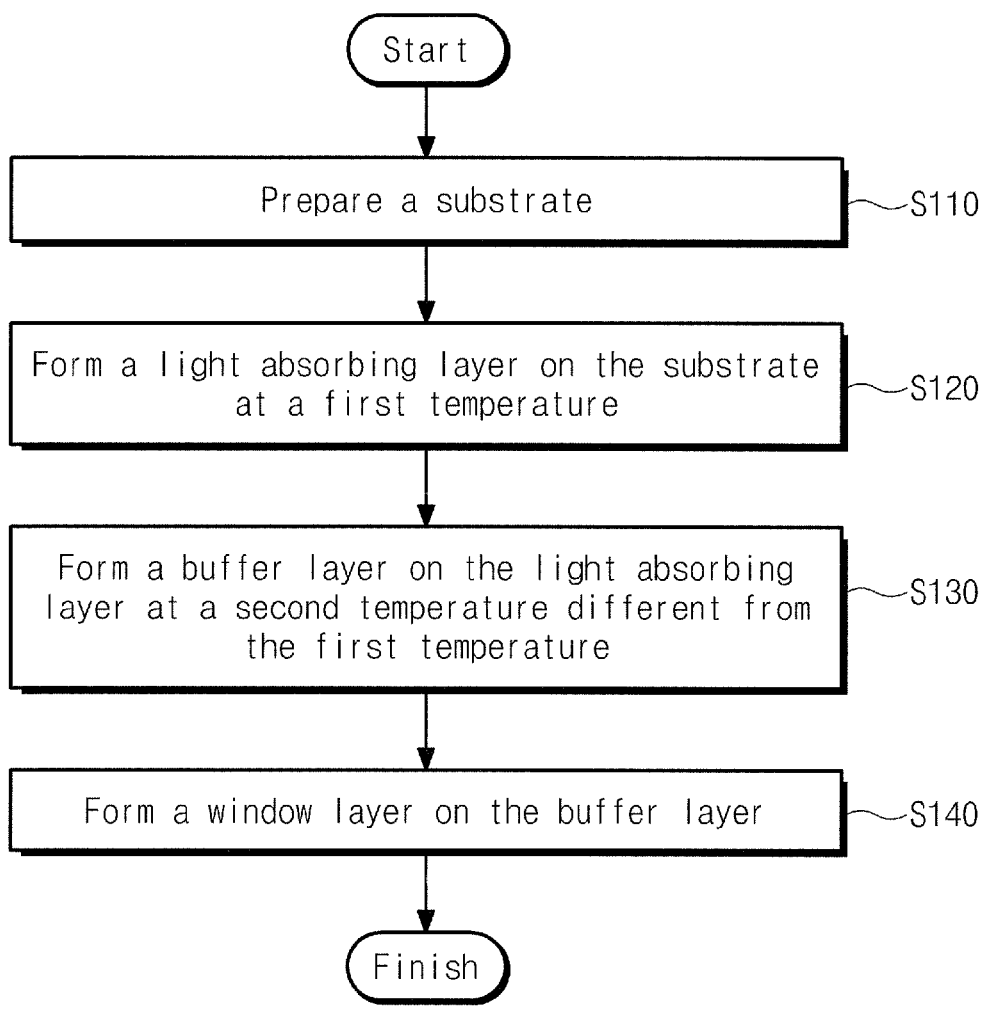
FIG. 1 is a flowchart illustrating a method of fabricating a solar cell according to an exemplary embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As used herein, the term "a source" includes a material that is provided into a chamber to form a layer on a substrate. In other words, the term "the source" may include both a source gas and a target material.

Figure 2:
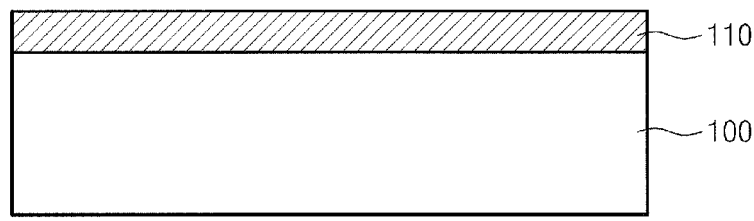
FIGS. 2 to 4 are cross-sectional views illustrating a solar cell and a method of fabricating the same according to an exemplary embodiment of the inventive concepts.
Figure 3:
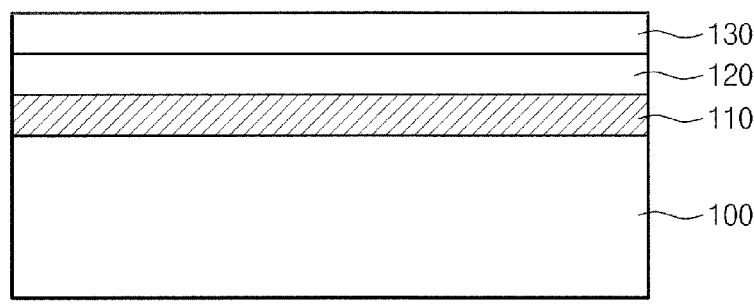
Figure 4:
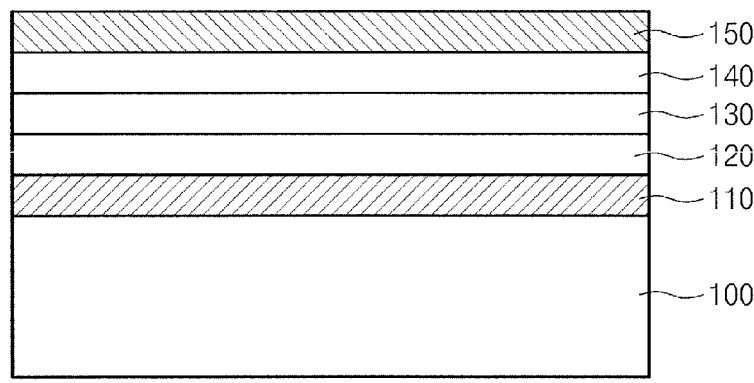

FIG. 1 is a flowchart illustrating a method of fabricating a solar cell according to an exemplary embodiment of the inventive concepts. FIGS. 2 to 4 are cross-sectional views illustrating a solar cell and a method of fabricating the same according to an exemplary embodiment of the inventive concepts.

Referring to FIGS. 1 and 2, a substrate 100 is prepared (S110). The substrate 100 may be prepared in a chamber. The substrate 100 may be one of various substrates such as a glass substrate and a plastic substrate.

A lower electrode layer 110 may be formed on the substrate 100. The lower electrode layer 110 may be formed by a sputtering method or an evaporation method. For example, the lower electrode layer 110 may be formed of molybdenum (Mo).

Referring to FIGS. 1 and 3, a light absorbing layer 120 may be formed on the substrate 100 having the lower electrode layer 110 (S120). The light absorbing layer 120 may absorb visible light. Forming the light absorbing layer 120 may include setting temperature in the chamber having the substrate 100 to a first temperature and supplying a first source into the chamber. According to an embodiment, the first temperature may be higher than 150° C. A thickness of the light absorbing layer 120 may be in a range of 100 nm to 2 μm.

The first source may include tin (Sn) and sulfur (S). For example, the first source may include at least one of tetrakis (dimethylamino)tin (TDMASn), tin(IV) chloride (SnCl), tin 2,4-pentanedionate ($Sn(acac)_2$), or bis(N,—N'-didisopropylacetamidinato)tin(II) ($Sn(amd)_2$) and may include at least one of $H_2S$ or $Na_2S_2O_3$.

The light absorbing layer 120 may be formed by a dry process. For example, the light absorbing layer 120 may be formed by a sputtering method, an e-beam evaporation method, a thermal evaporation method, a pulsed laser deposition method, a successive ionic layer adsorption and reaction method (SILAR), a thermal chemical vapor deposition method, a plasma-enhanced chemical vapor deposition method, an atomic layer deposition method, or a plasma-enhanced atomic layer deposition method.

The light absorbing layer 120 may include a first compound which is formed on the lower electrode layer 110 by supplying the first source into the chamber at the first temperature. According to an embodiment, the first compound of the light absorbing layer 120 may include tin(II) sulfide (SnS) that is formed by the atomic layer deposition method using a precursor including tin (e.g., the TDMASn precursor) and a reaction gas including sulfur (e.g., the $H_2S$ gas).

Unlike the aforementioned embodiment of the inventive concepts, if CuInSe, $CuInSe_2$, CuInGaSe, or $CuInGaSe_2$ is used as a light absorbing layer of a solar cell, a fabrication cost of the solar cell may be increased due to high costs of indium (In) and gallium (Ga). In addition, since the light absorbing layer using copper (Cu), indium (In), gallium, and selenium (Se) is formed of various kinds of materials by various kinds of fabrication processes (e.g., a sputtering process, an annealing process, and a wet process), it may be difficult to optimize fabrication processes of the solar cell.

However, if SnS is used as light absorbing layer 120 of the solar cell as described in the aforementioned embodiment of the inventive concepts, the use of expensive indium (In) and gallium (Ga) can be minimized to reduce the fabrication cost of the solar cell. In addition, since SnS is a binary compound, it is possible to easily optimize the process for forming the light absorbing layer 120 formed of SnS. As a result, it is possible to provide the solar cell capable of reducing the fabrication cost and of easily optimizing the process and the method of fabricating the same.

A buffer layer 130 may be formed on the light absorbing layer 120 (S130). The buffer layer 130 may relax mismatch between a lattice of the light absorbing layer 120 and a lattice of a window layer 140 described below and distortion between conductive bands of the light absorbing layer 120 and the window layer 140, thereby preventing recombination of electrons and holes. A thickness of the buffer layer 130 may be smaller than that of the light absorbing layer 120. For example, the thickness of the buffer layer 130 may be in a range of 10 nm to 100 nm.

Forming the buffer layer 130 may include setting temperature in the chamber having the substrate 100 having the light absorbing layer 120 to a second temperature and supplying the first source into the chamber. The second temperature is different from the first temperature. The second temperature may be lower than the first temperature. For example, the second temperature may be 150° C. or less.

The buffer layer 130 may include a second compound that is formed by supplying the first source into the chamber at the second temperature. According to an embodiment, the second compound of the buffer layer 130 may include tin(IV) sulfide ($SnS_2$) that is formed at the second temperature by an atomic layer deposition method using a precursor including tin (e.g., the TDMASn precursor) and a reaction gas including sulfur (e.g., the $H_2S$ gas).

The buffer layer 130 and the light absorbing layer 120 may be formed using the first source in the same chamber. Here, the buffer layer 130 may be formed at the second temperature lower than the first temperature at which the light absorbing layer 120 is formed. Thus, the second compound (e.g., $SnS_2$) may include the same elements as the first compound (e.g., SnS) but a composition ratio of the second compound may be different from that of the first compound.

As a result, a photonic band gap of the buffer layer 130 including the second compound may be different from a photonic band gap of the light absorbing layer 120 including the first compound. For example, the photonic band gap of the buffer layer 130 may be in a range of 2.4 eV to 2.8 eV, and the photonic band gap of the light absorbing layer 120 may be in a range of 1.6 eV to 1.7 eV.

In addition, a crystal structure of the buffer layer 130 including the second compound may be different from a crystal structure of the light absorbing layer 120 including the first compound. According to an embodiment, the light absorbing layer 120 (e.g., SnS) may have an orthorhombic crystal structure, and the buffer layer 130 (e.g., $SnS_2$) may have a hexagonal crystal structure.

In other embodiments, the buffer layer 130 may further include a third compound stacked on the second compound. In this case, forming the buffer layer 130 may further include supplying a second source into the chamber before or after supplying the first source into the chamber.

The second source may include tin (Sn) and oxygen (O). For example, the second source may include at least one of tetrakis(dimethylamino)tin (TDMASn), Tin(IV) chloride (SnCl), tin 2,4-pentanedionate ($Sn(acac)_2$), or bis(N,—N'-didisopropylacetamidinato)tin(II) ($Sn(amd)_2$) and may include $H_2O$.

In other words, the buffer layer 130 formed according to other embodiments of the inventive concepts may include the second compound (e.g., $SnS_2$) formed by supplying the first source into the chamber at the second temperature and the third compound (e.g., $SnO_2$) formed by supplying the second source into the chamber at the second temperature. In this case, a composition ratio of the second compound (e.g., $SnS_2$) and the third compound (e.g., $SnO_2$) may be controlled to adjust the photonic band gap of the buffer layer 130.

If cadmium-sulfur (CdS) is used as a buffer layer of a solar cell unlike the aforementioned embodiments of the inventive concepts, environmental pollution may be caused by cadmium (Cd) having potent toxicity. In addition, since the CdS buffer layer is formed by a wet process, fabrication processes of the solar cell may be complicated and the solar cell may be exposed in air so as to be easily affected by oxygen and water. Furthermore, characteristics of the CdS buffer layer may be greatly varied according to a mole ratio of an aqueous solution used for forming the CdS buffer layer, so it may be difficult to secure reliability of the CdS buffer layer.

However, according to the aforementioned embodiments of the inventive concepts, $SnS_2$ or $SnS_2/SnO_2$ may be used as the buffer layer 130. In other words, the buffer layer 130 may be formed by the dry process. Thus, the light absorbing layer 120 and the buffer layer 130 may be sequentially and continuously formed in the same chamber. In addition, it is possible to minimize use of a heavy metal (e.g., Cd) which is harmful to the human body. As a result, fabrication processes of the solar cell may be simplified and an eco-friendly solar cell may be realized.

Referring to FIGS. 1 and 4, a window layer 140 may be formed on the buffer layer 130 (S140). The window layer 140 may be formed together with the light absorbing layer 120 and the buffer layer 130 in the same chamber by a dry process. Forming the window layer 140 may include setting temperature in the chamber to the second temperature and supplying the second source into the chamber. According to an embodiment, the window layer 140 may include $SnO_2$ which is formed by an atomic layer deposition method using a precursor including tin (e.g., the TDMASn precursor) and a reaction gas including sulfur (e.g., the $H_2O$ gas).

If zinc oxide (ZnO) or zinc oxide doped with aluminum (ZnOAl) is used as a window layer of a solar cell unlike the aforementioned embodiment of the inventive concepts, the buffer layer 130 may be damaged by a sputtering process used for forming the ZnO or ZnOAl window layer. Thus, reliability of the buffer layer 130 may be deteriorated to reduce efficiency and characteristics of the solar cell.

However, according to the aforementioned embodiments of the inventive concepts, $SnO_2$ may be used as the window layer 140 of the solar cell. Thus, the light absorbing layer 120, the buffer layer 130, and the window layer 140 may be sequentially and continuously formed in the same chamber. This means that the fabricating efficiency of the solar cell may be improved. In addition, the window layer 140 may be formed by a chemical vapor deposition method, so it is possible to minimize damage of the buffer layer 130 disposed under the window layer 140. Moreover, the window layer 140 may be formed using a metal precursor which is the same as the metal precursor (e.g., the precursor including tin) used for forming the buffer layer 130 and the light absorbing layer 120, and thus, the precursor required to fabricate the solar cell may be efficiently managed.

An upper electrode layer 150 may be formed on the window layer 140. The upper electrode layer 150 may be formed of a transparent conductive material. For example, the upper electrode layer 150 may be formed of indium-tin oxide (ITO), gallium-zinc oxide (GZO), or aluminum-zinc oxide (AZO).

Characteristics of the light absorbing layer 120 and the buffer layer 130 formed by according to embodiments of the inventive concepts will be described hereinafter.

Figure 5:
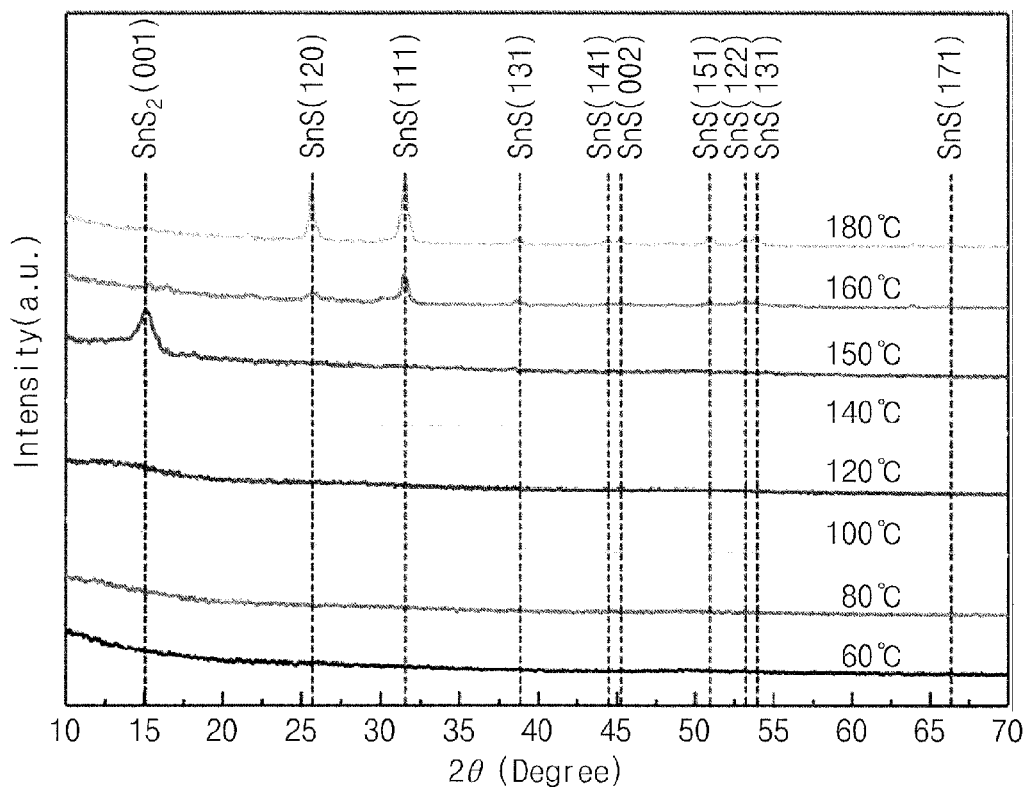
FIG. 5 is an X-ray diffraction (XRD) graph illustrating characteristics of a light absorbing layer and a buffer layer included in a solar cell according to an exemplary embodiment of the inventive concepts.
Figure 6:
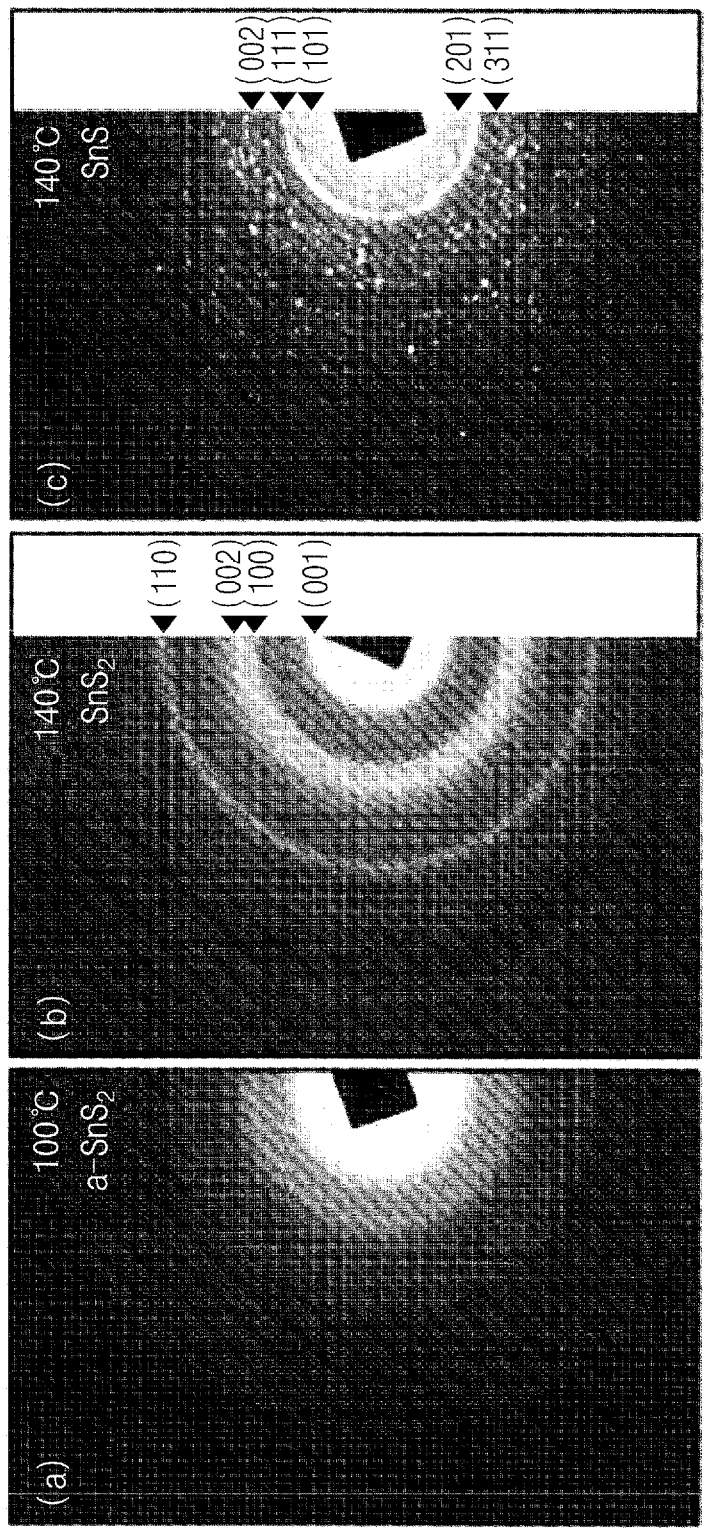
FIG. 6 shows transmission electron microscopy (TEM) diffraction patterns to explain characteristics of a light absorbing layer and a buffer layer included in a solar cell according to an exemplary embodiment of the inventive concepts.

FIG. 5 is an X-ray diffraction (XRD) graph illustrating characteristics of a light absorbing layer and a buffer layer included in a solar cell according to an exemplary embodiment of the inventive concepts. FIG. 6 shows transmission electron microscopy (TEM) diffraction patterns to explain characteristics of a light absorbing layer and a buffer layer included in a solar cell according to an exemplary embodiment of the inventive concepts.

Referring to FIG. 5, $SnS_x$ layers (where "x" denotes a positive integer) were deposited by the atomic layer deposition method which supplies the TDMASn precursor and the $H_2S$ reaction gas into the chamber at process temperatures of 60° C. to 180° C. As shown in FIG. 5, a $SnS_2$ layer having the orthorhombic crystal structure was formed at the process temperature of 150° C. or less, and a SnS layer having the hexagonal crystal structure was formed at the process temperature higher than 150° C.

Referring to FIG. 6, reference designators (a), (b), and (c) of FIG. 6 are TEM diffraction patterns of SnS layers formed at process temperatures of 100° C., 140° C., and 180° C., respectively. An amorphous $SnS_2$ layer was deposited at the process temperature of 100° C., the $SnS_2$ layer having the orthorhombic crystal structure was deposited at the process temperature of 140° C., and the SnS layer having the hexagonal crystal structure was deposited at the process temperature of 180° C.

As described with reference to FIGS. 5 and 6, if the process temperatures are different from each other even though the source gases are the same as each other, it is possible to deposit the SnS layer and $SnS_2$ layer which have different composition ratios and different crystal structures from each other.

Figure 7:
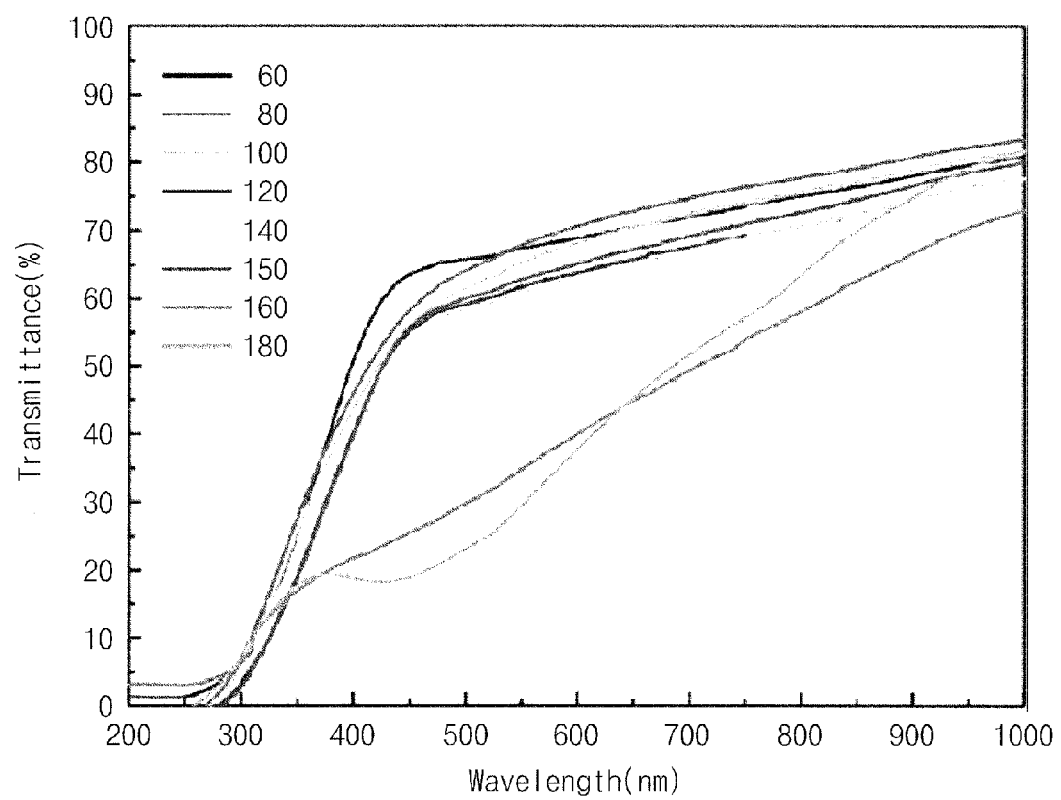
FIG. 7 is a graph illustrating light transmittances of a light absorbing layer and a buffer layer included in a solar cell according to an exemplary embodiment of the inventive concepts.
Figure 8:
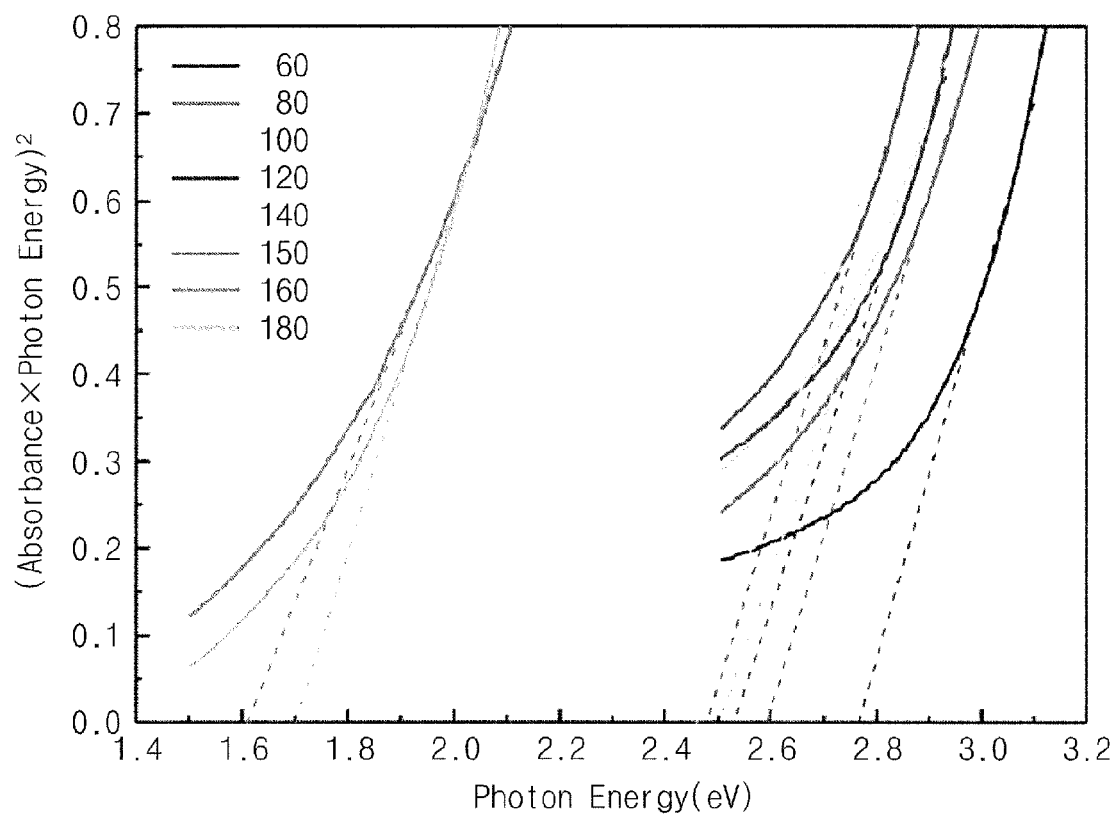
FIG. 8 is a graph illustrating photonic band gaps of a light absorbing layer and a buffer layer included in a solar cell according to an exemplary embodiment of the inventive concepts.

FIG. 7 is a graph illustrating light transmittances of a light absorbing layer and a buffer layer included in a solar cell according to an exemplary embodiment of the inventive concepts. FIG. 8 is a graph illustrating photonic band gaps of a light absorbing layer and a buffer layer included in a solar cell according to an exemplary embodiment of the inventive concepts.

Referring to FIG. 7, a transmittance of the layer with respect to visible light is progressively reduced from 68.25% to 61.68% as the process temperature increases from 60° C. to 150° C. In particular, it was confirmed that the transmittances of the SnS layers deposited at the temperatures of 160° C. and 180° C. were rapidly reduced.

Referring to FIG. 8, the photonic band gaps of the $SnS_2$ layers deposited at temperatures of 150° C. and less were in the range of 2.4 eV to 2.8 eV, and the photonic band gaps of the SnS layers deposited at the temperatures of 160° C. and 180° C. were in the range of 1.6 eV to 1.7 eV.

As described with reference to FIGS. 7 and 8, the SnS layer deposited at the relatively high temperature (e.g., the temperature higher than 150° C.) may absorb the visible light, but the $SnS_2$ layer deposited at the relatively low temperature (e.g., the temperature of 150° C. or less) may not absorb the visible light. In other words, the $SnS_2$ layer deposited at the relatively low temperature may be used as the buffer layer. As a result, the SnS layer and the $SnS_2$ layer formed using the same source gas at the different temperatures may be used as the light absorbing layer and the buffer layer of the solar cell, respectively.

An application example of the solar cell according to the above embodiment will be described hereinafter.

Figure 9:
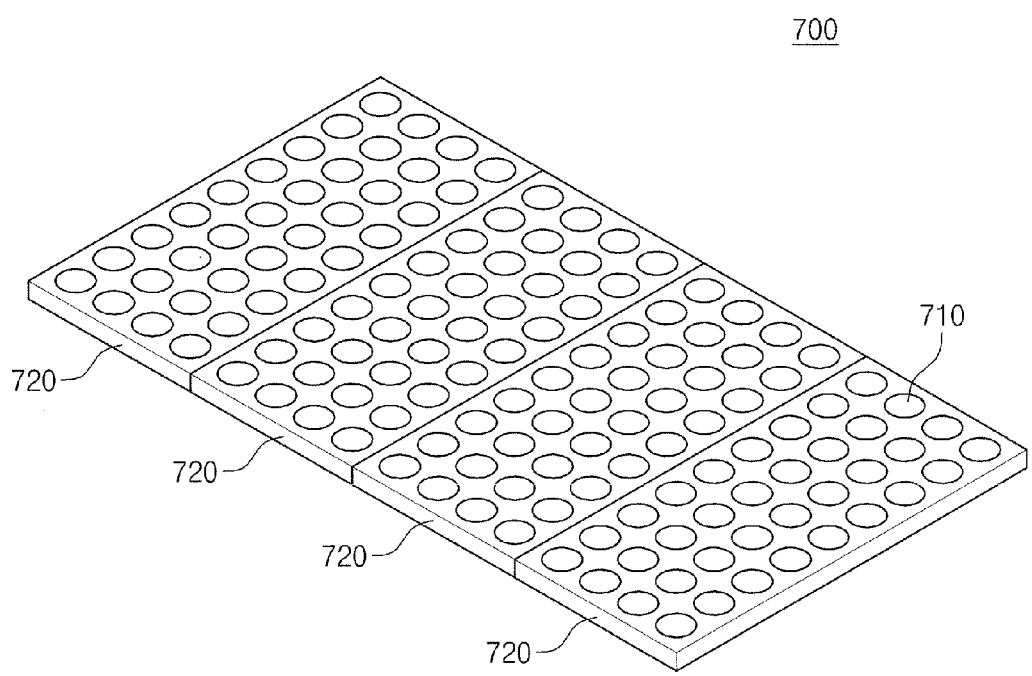
FIG. 9 is a schematic diagram illustrating a solar cell array including a solar cell according to an exemplary embodiment of the inventive concepts.

FIG. 9 is a schematic diagram illustrating a solar cell array including a solar cell according to an exemplary embodiment of the inventive concepts.

Referring to FIG. 9, a solar cell array 700 may include one or more solar cell modules 720 installed in a main frame (not shown). Each of the solar cell modules 720 may include a plurality of solar cells 710. The solar cell 710 may be the solar cell according to the aforementioned embodiment of the inventive concepts. The solar cell array 700 may be equipped at a predetermined angle toward the south in order to easily receive the light of the sun.

The solar cell module 720 or the solar cell array 700 described above may be equipped on a car, a house, a building, a boat, a light tower, a traffic signal system, a portable device, or other various structures.

Figure 10:
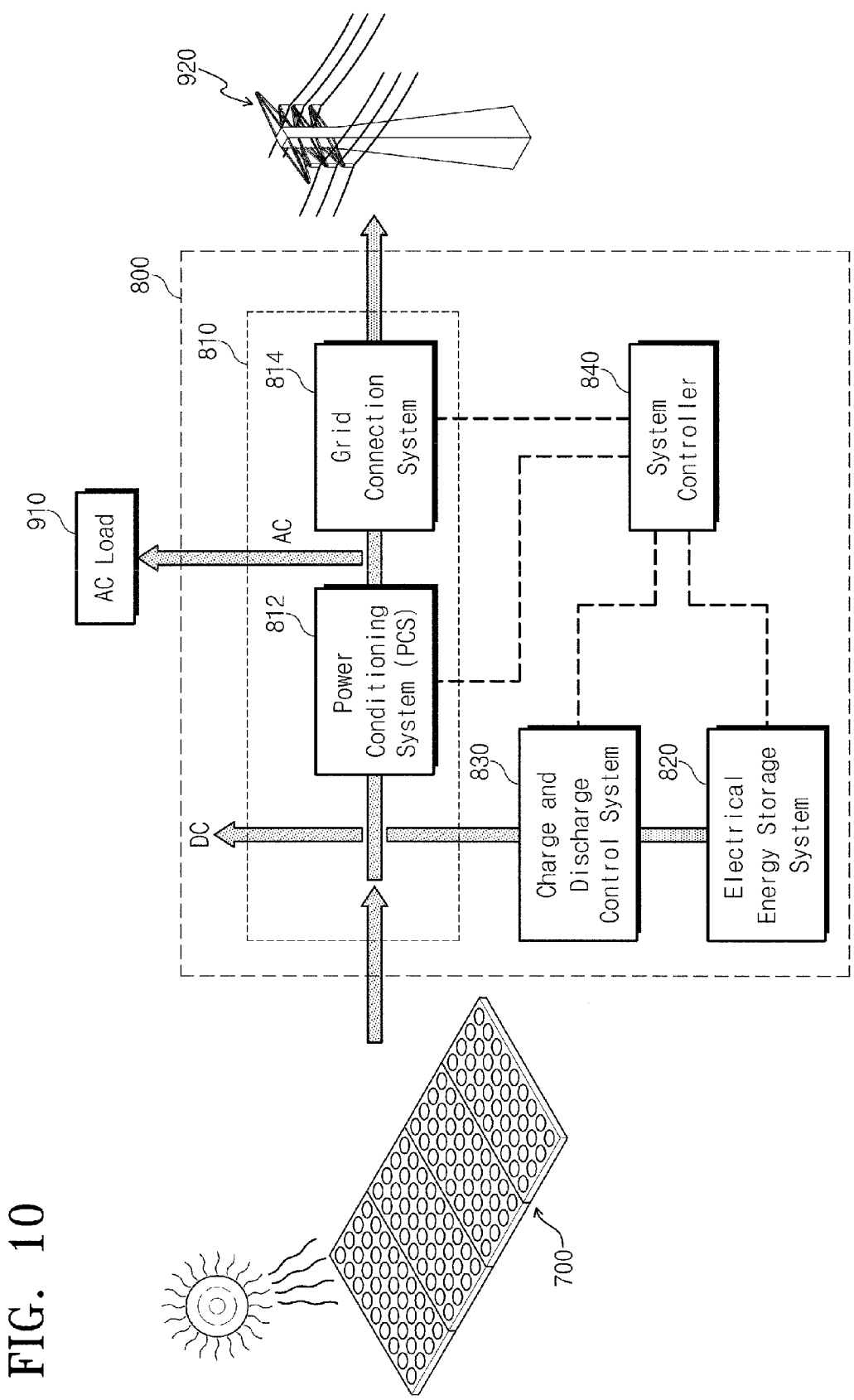
FIG. 10 is a schematic diagram illustrating an example of a solar photovoltaic power generation system including a solar cell according to an exemplary embodiment of the inventive concepts.

FIG. 10 is a schematic diagram illustrating an example of a solar photovoltaic power generation system including a solar cell according to an exemplary embodiment of the inventive concepts.

Referring to FIG. 10, the solar photovoltaic power generation system may include the solar cell array 700 and a power control system 800. The power control system 800 may be supplied with electric power from the solar cell array 700 to transmit the electric power to an external system. The power control system 800 may include an output system 810, an electrical energy storage system 820, a charge and discharge control system 830, and a system controller 840. The output system 810 may include a power conditioning system (PCS) 812.

The PCS 812 may correspond to an inverter that converts a direct current (DC) received from the solar cell array 700 into an alternating current (AC). Since the light of the sun does not exist at night and is reduced on cloudy days, generated electric power may be reduced. The electrical energy storage system 820 may store the electric power in order to prevent the generated electric power from being varied according to the weather. The charge and discharge control system 830 may store the electric power received from the solar cell array 700 into the electrical energy storage system 820 or may output the electric power stored in the electrical energy storage system 820 to the output system 810. The system controller 840 may control the output system 810, the electrical energy storage system 820, and the charge and discharge control system 830.

As described above, the converted AC may be supplied to an AC load 910. The AC load 910 may be at least one of various loads such as a car and a household. In addition, the output system 810 may further include a grid connection system, 814. The grid connection system 814 may be connected to another power system 920 to transmit the electric power to an external system.

According to embodiments of the inventive concepts, the light absorbing layer, the buffer layer, and the window layer may be continuously formed in a lump in the same chamber by the dry processes. Thus, it is possible to simplify the fabricating processes of the solar cell.

In addition, the use of indium (In) and gallium (Ga) may be minimized during the formation of the light absorbing layer, and the light absorbing layer may be formed of the binary compound. Thus, the fabrication cost of the solar cell may be reduced and the fabricating processes of the solar cell may be optimized.

Furthermore, the use of the heavy metal harmful to the human body may be minimized during the formation of the buffer layer, so it is possible to provide the eco-friendly solar cell and the method of fabricating the same.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A solar cell comprising:
a light absorbing layer disposed on a substrate and including a first compound;
a buffer layer disposed on the light absorbing layer and including a second compound and a third compound, the second compound including same elements as the first compound, and the second compound having a composition ratio different from that of the first compound; and
a window layer disposed on the buffer layer,
wherein the third compound includes an oxide of a metal element included in the first and second compounds, and is disposed between the first compound and the second compound.

2. The solar cell of claim 1, wherein the light absorbing layer and the buffer layer have different crystal structures from each other.

3. The solar cell of claim 1, wherein the light absorbing layer has an orthorhombic crystal structure, and
wherein the buffer layer has a hexagonal crystal structure.

4. The solar cell of claim 1, wherein the first compound includes SnS, and
wherein the second compound includes $SnS_2$.

5. The solar cell of claim 1, wherein the buffer layer includes the oxide of the metal element included in the first and second compounds.

6. The solar cell of claim 1, wherein each of the light absorbing layer and the buffer layer is formed of a binary compound.

7. The solar cell of claim 1, wherein the light absorbing layer is formed of a non-rare-earth element, and wherein the buffer layer is formed of a non-cadmium element.

* * * * *